(12) United States Patent
Guo et al.

(10) Patent No.: US 9,842,639 B1
(45) Date of Patent: Dec. 12, 2017

(54) SYSTEMS AND METHODS FOR MANAGING READ VOLTAGES IN A CROSS-POINT MEMORY ARRAY

(71) Applicant: Kilopass Technology, Inc., San Jose, CA (US)

(72) Inventors: Frank Guo, Danville, CA (US); Bruce Bateman, Fremont, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/288,874

(22) Filed: Oct. 7, 2016

(51) Int. Cl.
*G11C 11/39* (2006.01)

(52) U.S. Cl.
CPC .................................. *G11C 11/39* (2013.01)

(58) Field of Classification Search
CPC ....................................................... G11C 11/39
See application file for complete search history.

(56) References Cited

U.S. PATENT DOCUMENTS

| 7,460,395 | B1* | 12/2008 | Cho | G11C 11/39 |
| | | | | 365/159 |
| 8,310,858 | B2* | 11/2012 | Ito | G11C 5/147 |
| | | | | 365/148 |
| 8,576,649 | B1* | 11/2013 | Nemati | G11C 7/065 |
| | | | | 365/189.05 |
| 8,848,424 | B2* | 9/2014 | Ikeda | G11C 13/00 |
| | | | | 365/148 |
| 8,982,603 | B2* | 3/2015 | Azuma | G11C 11/21 |
| | | | | 365/148 |

* cited by examiner

*Primary Examiner* — Tri Hoang
(74) *Attorney, Agent, or Firm* — Aka Chan LLP (57) ABSTRACT

Techniques are provided for managing voltages on memory cells in a cross-point array during a read operation. The techniques apply to vertical layer thyristor memory cells and non-thyristor memory cells. Voltages on selected bitlines (e.g., corresponding to memory cells from which data is to be read), are set to a read voltage level. Voltages on unselected bitlines (e.g., corresponding to memory cells from which data is not to be read and which are not to be disturbed) are set to a de-bias voltage level that is different from the read voltage level.

20 Claims, 4 Drawing Sheets

SYSTEMS AND METHODS FOR MANAGING READ VOLTAGES IN A CROSS-POINT MEMORY ARRAY

FIELD OF THE DISCLOSURE

The present disclosure relates generally to Random-Access Memory (RAM) memory technologies (e.g., volatile and non-volatile memories), and more particularly to memory storage that uses a cross-point array.

BACKGROUND OF THE DISCLOSURE

Cross-point memory arrays can provide a dense, closely packed structure of memories. Memory cells used in cross-point memory arrays may have a resistive state (e.g., a high resistance state) or non-conducting state, and a conductive state (e.g., a low resistance state) or conducting state. The process of accessing a memory cell within an array in order to read information stored within the memory cell may disturb neighboring memory cells in the cross-point memory array that are coupled to the memory cell by a common Bit-line or a common Word-line. Techniques are needed to control the voltage levels across the memory cell to avoid disturbing neighboring cells.

SUMMARY OF THE DISCLOSURE

Systems and methods are provided for managing voltages applied to memory cells in a cross-point memory array during a read operation to access data from the cross-point memory array (e.g., by detecting whether one or more memory cells in the cross-point array is in a high resistance state or a low-resistance state). For example, the memory cells in a cross-point memory array may be located at the intersections of a first plurality of electrically conducting lines (e.g., Word-lines), and a second plurality of electrically conducting lines (e.g., Bit-lines). In some embodiments, each memory cell in a cross-point memory array be located at an intersection between a Bit-line and a Word-line. In some embodiments, each memory cell in a cross-point memory array be located at an intersection between a Bit-line and two or more Word-lines. For example, a memory cell may be located at an intersection between a pair of parallel or substantially parallel Word-lines connected to the memory cell, and a Bit-line connected to the memory cell.

In some embodiments, the data may be read from the selected subset of the memory cells by detecting whether a voltage level on a subset (e.g., selected Bit-lines) of the second plurality of electrically conducting lines (e.g., Bit-lines) transitions from a first voltage level to a read-voltage level, indicating whether a respective memory cell (e.g., corresponding to a selected Bit-line) is in a high resistance state or a low resistance state. When performing a read operation, the first plurality of electrically conducting lines (e.g., Word-lines) and the second plurality of electrically conducting lines (e.g., Bit-lines) may be set and/or changed (e.g., switched) to various voltages according to a sequence, in order to access a selected subset of the memory cells and read data from the selected subset of the memory cells. The sequence of biasing the first plurality of electrically conducting lines (e.g., Word-lines) and the second plurality of electrically conducting lines (e.g., Bit-lines) reduces unintended current flows through unselected memory cells.

For example, a voltage applied to the first plurality of electrically conducting lines (e.g., Word-lines) may be set to a standby voltage to reduce current flowing through the memory cells coupled to the first plurality of electrically conducting lines (e.g., Word-lines). As referred to herein, the term "coupled to" may be understood to refer to directly or indirectly connected (e.g., through an electrical connection). Subsequently, a voltage applied to a second plurality of electrically conducting lines (e.g., Bit-lines) may be set to a first voltage level (e.g., a precharge voltage level). Subsequently a voltage applied to a first subset (e.g., unselected Bit-lines) of the second plurality of electrically conducting lines (e.g., Bit-lines) may be transitioned from the first voltage level to a de-biased voltage level, in order to unselect the first subset by reducing current flowing through memory cells coupled to the first subset (e.g., unselected Bit-lines). Subsequently, a voltage applied to a subset (e.g., selected Word-lines) of the first plurality of electrically conducting lines (e.g., Word-lines), may be changed (e.g., switched) from the standby voltage level to a first read voltage level. The changing of voltage applied to the subset (e.g., selected Word-lines) of the first plurality of electrically conducting lines (e.g., Word-lines) applies a voltage drop across selected memory cells at the intersections of the second subset (e.g., selected Bit-lines) of the second plurality of electrically conducting lines (e.g., Bit-lines), and the subset (e.g., selected Word-lines) of the first plurality of electrically conducting lines (e.g., Word-lines). Subsequently, voltage levels corresponding to the second subset (e.g., selected Bit-lines) of the second plurality of electrically conducting lines (e.g., Bit-lines) may be monitored to detect whether a respective voltage level of an electrically conducting line of the second subset (e.g., selected Bit-line) transitions from a first voltage level to a second read voltage level, and thereby detect a state of a corresponding selected memory cell. For example, if a transition occurs, then a corresponding cell may be in a low resistance state. If a transition does not occur, the cell is may be a high resistance state.

In some embodiments, an apparatus for accessing at least one memory cell (e.g., one or more memory cells) in a cross-point memory array of memory cells, includes a first plurality of driver circuitry (e.g., row and/or Word-line drivers), a second plurality of driver circuitry (e.g., column and/or Bit-line drivers), and a plurality of sense amplifier circuitry. The cross-point memory array may include a first plurality of electrically conducting lines (e.g., Word-lines), and a second plurality of electrically conducting lines (e.g., Bit-lines). The first plurality of driver circuitry (e.g., row and/or Word-line drivers) may be configured to set voltages applied to a first plurality of electrically conducting lines (e.g., Word-lines) to a standby voltage level. The second plurality of driver circuitry (e.g., column and/or Bit-line drivers) may be configured to change the voltage applied to the first subset (e.g., unselected Bit-lines) of the second plurality of electrically conducting lines (e.g., Bit-lines) from a first voltage level (e.g., a precharge voltage level) to a de-biased voltage level. Subsequent to the second plurality of driver circuitry (e.g., column and/or Bit-line drivers) changing the voltage applied to the first subset (e.g., unselected Bit-lines) of the second plurality of electrically conducting lines (e.g, Bit-lines), the first plurality of driver circuitry (e.g., row and/or Word-line drivers) may be configured to change voltages applied to a subset (e.g., selected Word-lines) of the first plurality of electrically conducting lines (e.g., Word-lines) from the standby voltage level to a first read voltage level.

A plurality of sense amplifier circuitry may be configured to detect whether a voltage at each conducting line (e.g., selected Bit-line) of a second subset (e.g., selected Bit-lines) of the second plurality of electrically conducting lines (e.g., Bit-lines) changes from the first voltage level to a second read voltage level, subsequent to the first plurality of driver circuitry changing voltages applied to the subset (e.g., selected Word-lines) of the first plurality of electrically conducting lines (e.g., Word-lines).

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION OF THE DRAWINGS

Memory cells arranged in cross-point arrays offer a promising memory technology. These memory cells in the cross-point array may be arranged as an array of minimum $4F^2$ cells, thereby minimizing cell area and reducing fabrication cost. Memory cells in a cross-point array may also be arranged in a stacked configuration to further increase the density of memory cells in a cross-point array. The memory cells in the cross-point array can be uniquely accessed without one or more select transistors. The memory cells in the cross-point array may have a high resistance state or a non-conducting state, and a low resistance state or a conducting state. In some embodiments, the high resistance state/non-conducting state may be referred to as an ON state, and the low resistance state/conducting state may be referred to as an OFF state. In some embodiments, the high resistance state/non-conducting state may be referred to as an OFF state, and the low resistance state/conducting state may be referred to as the ON state.

A memory cell can be selected in a cross-point array by toggling Bit-lines (BLs) and Word-lines (WLs) appropriately for read and write operations. For example, a first memory cell located at the intersection of a first BL and a first WL may be selected by biasing the first BL and/or the first WL, and subsequently sensing current at the first BL and/or the first WL to detect whether the first memory cell is in a high resistance state (HRS) or a non-conducting state, or a low resistance state (LRS) or a conducting state. To avoid non-ideal current paths (e.g., sneak-paths) that may cause an HRS of the first memory cell to be incorrectly detected as a LRS, a steering device (e.g., such as a diode or other non-linear semiconductor device exhibiting rectifying behavior), may be fabricated as part of or in addition to the memory cell. Examples of memory cells that can be used in cross-point memory array include Spin Transfer Torque-Magnetoresistive Random-Access Memory (STT-MRAM), Resistive-RAM, Phase-Change RAM, and Vertical Layer Thyristor (VLT) RAM, and One-Time Programmable (OTP) RAM. In some embodiments, each memory cell in a cross-point memory array be located at an intersection between a Bit-line and a Word-line. In some embodiments, each memory cell in a cross-point memory array be located at an intersection between a Bit-line and two or more Word-lines. For example, a memory cell may be located at an intersection between a pair of parallel or substantially parallel Word-lines connected to the memory cell, and a Bit-line connected to the memory cell.

Figure 1:
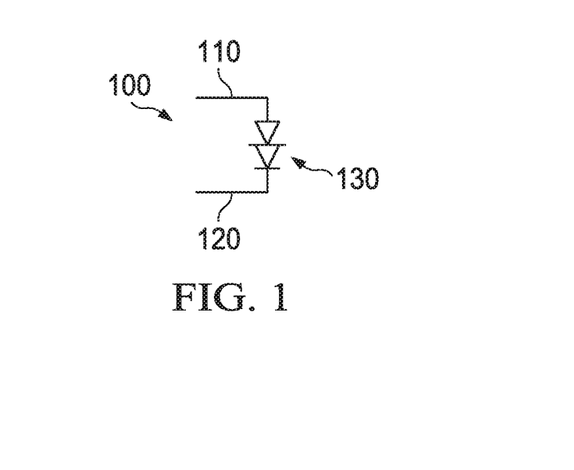
FIG. 1 depicts a diagram of a vertical layer thyristor (VLT) memory cell in accordance with some embodiments of the present disclosure.
Figure 2:
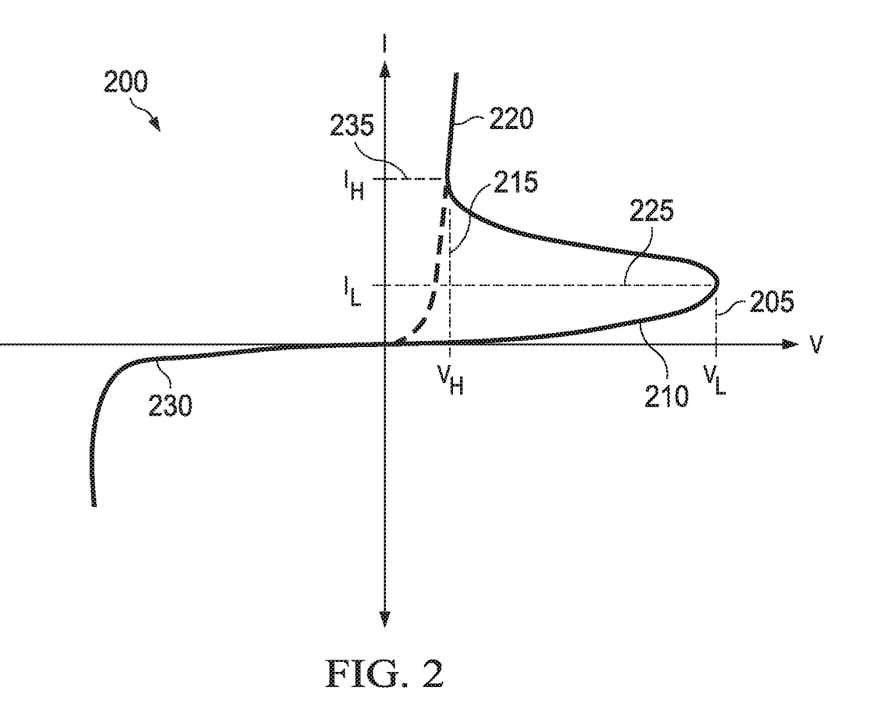
FIG. 2 depicts a current voltage graph that describes the operation of a VLT memory cell, in accordance with some embodiments of the present disclosure.

FIG. 1 depicts a diagram of a vertical layer thyristor (VLT) memory cell in accordance with some embodiments of the present disclosure. Advantages of thyristors include the ability to precisely tune operating characteristics (e.g., switching speed, static power consumption, dynamic power consumption, etc.) by tuning the geometry and composition of component layers of each thyristor cell. VTL memory cell 100 may include a VLT 130 coupled to a first electrically conducting line 110, and a second electrically conducting line 120. In some embodiments, the first electrically conducting line may be a BL, and the second electrically conducting line may be a WL. In some embodiments, the first electrically conducting line may be a WL, and the second electrically conducting line may be a BL. VLTs have an advantage over certain types of memory cells because VLTs exhibit non-linear rectifying behavior (e.g., of a diode). Accordingly, the use of a VLT memory cell may obviate the need for an additional or separate steering device FIG. 2 depicts a current voltage (IV) graph 200 that describes the operation of a VLT memory cell (e.g., depicted in FIG. 1), in accordance with some embodiments of the present disclosure. The x-axis or independent axis may correspond to voltage applied across the VLT memory cell. The y-axis or dependent axis may correspond to current through the VLT memory cell at a particular applied voltage. It should be understood that voltage applied across the cell may correspond to a voltage difference between a first electrically conducting line (e.g., 110 of FIG. 1) and a second electrically conducting line (e.g., 120 of FIG. 1), and that the voltage levels of the first electrically conducting line and the second electrically conducting line may be non-zero (e.g., greater than or less than zero volts).

The VLT memory cell may initially be in a high resistance state, corresponding to a portion 210 of the IV graph. As voltage across the VLT memory cell increases from zero along portion 210 of the IV graph, the current across the VLT memory cell increases under high resistance. When the voltage across the VLT memory cell exceeds a first threshold voltage 205 (e.g., a breakdown voltage or latching voltage $V_L$) and/or the current through the VLT memory cell exceeds a current 225 (e.g., a latching current), the VLT memory cell transitions from the high resistance state to a low resistance state, corresponding to a portion 220 of the IV graph. The low resistance state is indicated by the steeper slope of portion 220 of the IV graph as compared to portion 210 of the IV graph. After the transition from the high resistance state to the lower resistance state, the voltage across the VLT memory cell may decrease from $V_1$ 205, to $V_2$ 215. The current may correspond to $I_2$ at 225. In the low resistance state, as voltage across the VLT memory cell increases, the current increases according to portion 220 of the IV graph. As the voltage across the VLT memory cell decreases, the current decreases according to portion 220 of the IV graph.

When the voltage across the VLT memory cell, in the low resistance state, decreases below a second threshold voltage 215 (e.g., a holding voltage) and/or the current through the VLT memory cell decreases below current 235 (e.g., a holding current), the thyristor transitions from the low resistance state into the high resistance state. In some embodiments, current 235 (e.g., a holding current) may be greater than current 205 (e.g., a latching current). In some embodiments, current 235 (e.g., a holding current) may be less than current 205 (e.g., a latching current). When the voltage across the VLT cell decreases below zero, the current through the VLT memory cell follows portion 230 of the IV graph. The high resistance in portion 230 of the IV graph indicates rectifying behavior of the VLT memory cell.

Figure 3:
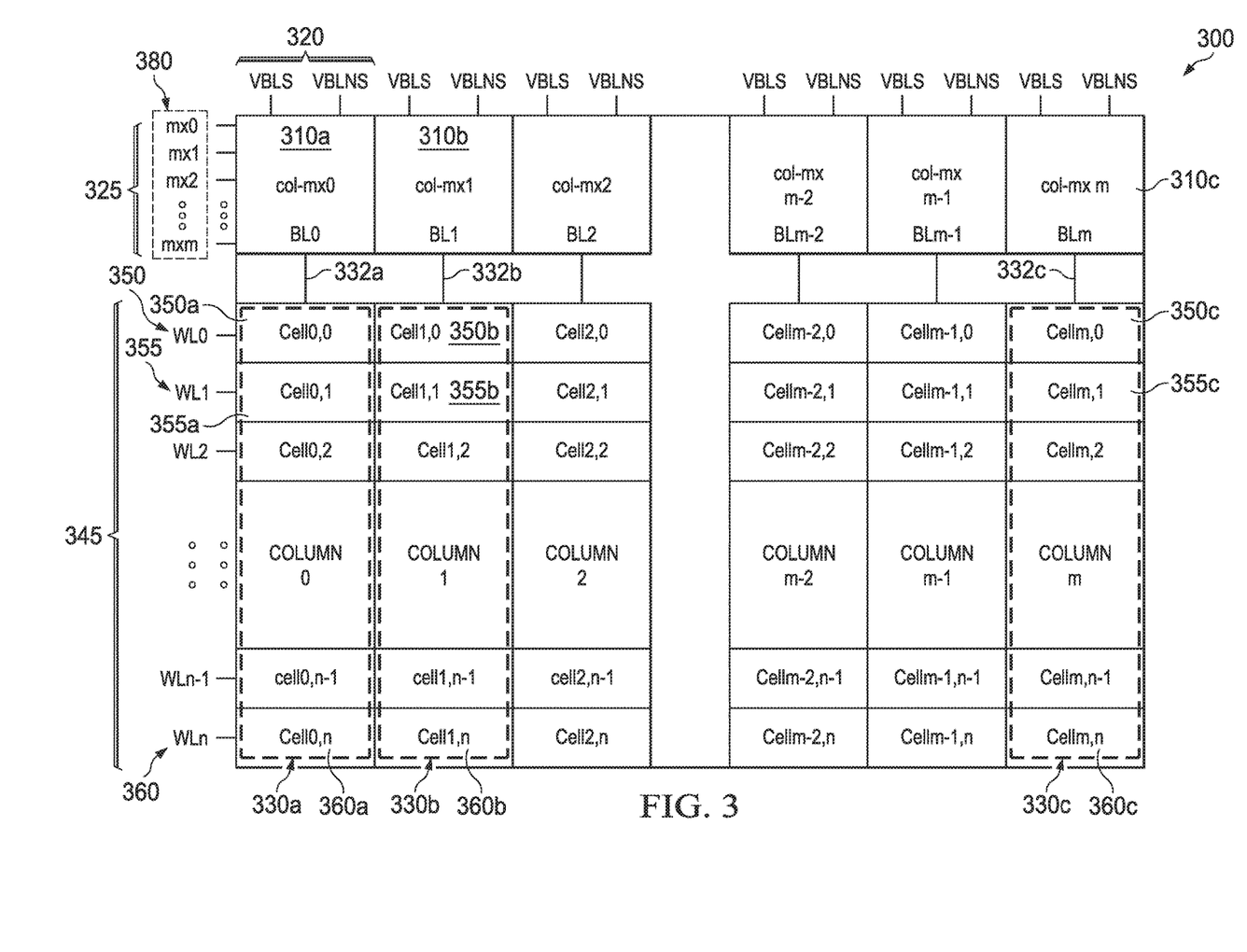
FIG. 3 depicts an apparatus for managing voltage levels within a cross-point memory array of memory cells when accessing a subset of the memory cells, in accordance with some embodiments of the present disclosure.

FIG. 3 depicts an apparatus for managing voltage levels within a cross-point memory array of memory cells 345 when accessing a subset of the memory cells, in accordance with some embodiments of the present disclosure. FIG. 3 includes m columns (e.g., 330a, 330b, 330c) and n rows of memory cells 345. In some embodiments, FIG. 3 depicts a sub-array block 300 of memory cells. Each row of memory cells may correspond to an electrically conducting line of a first plurality of electrically conducting lines (e.g., 350, 355, 360; $WL_0$ to $WL_n$). For example, a first row of memory cells (e.g., 350a, 350b, 350c) may correspond to electrically conducting line 350; a second row of memory cells (e.g., 355a, 355b, 355c) may correspond to electrically conducting line 355; and a third row of memory cells (e.g., 360a, 360b, 360c) may correspond to electrically conducting line 360. In some embodiments, the first plurality of electrically conducting lines may be WLs. In some embodiments, the first plurality of electrically conducting lines may be BLs.

Each column (e.g., 330a, 330b, 330c) of memory cells may correspond to an electrically conducting line of a second plurality of electrically conducting lines (e.g., 332a, 332b, 332c; $BL_0$-$BL_m$). For example, a first column 330a of memory cells (e.g., 350a, 355a, 360a) may correspond to electrically conducting line 332a; a second column 330b of memory cells (e.g., 350b, 355b, 360b) may correspond to electrically conducting line 332b; and a third column 330c of memory cells (e.g., 350c, 355c, 360c) may correspond to electrically conducting line 332c. In some embodiments, the second plurality of electrically conducting lines may be BLs. In some embodiments, the second plurality of electrically conducting lines may be WLs.

FIG. 3 may include a plurality 325 of column multiplexors (e.g., 310a, 310b, 310c; col-$mx_0$-col-$mx_m$). Each of the plurality 325 of column multiplexors may correspond to a respective column of memory cells, and a respective electrically conducting line of the second plurality of electrically conducting lines. For example, column multiplexor 310a may correspond to correspond to column 330a of memory cells and output to electrically conducting line 332a; column multiplexor 310b may correspond to correspond to column 330b of memory cells and output to electrically conducting line 332b; and column multiplexor 310c may correspond to correspond to column 330c of memory cells and output to electrically conducting line 332c.

Each of the plurality 325 of column multiplexors may select between two voltage levels 320: a voltage level for a selected column (e.g., VBLS, voltage bit-line select) and a voltage level for an unselected column (e.g., VBLNS, voltage bit-line non-select). The plurality 325 of column multiplexors may be controlled by a plurality of select inputs 380 (e.g., $mx_0$-$mx_m$), where each of the plurality of select inputs may correspond to a respective column multiplexor, and select between the voltage level for the selected column, and the voltage level for the unselected column. For example, if an input for a multiplexor is 1, the voltage for a selected column may be output, column read voltage level may be selected, and if the input for the multiplexor is 0, the de-biased voltage level may be selected.

Figure 4:
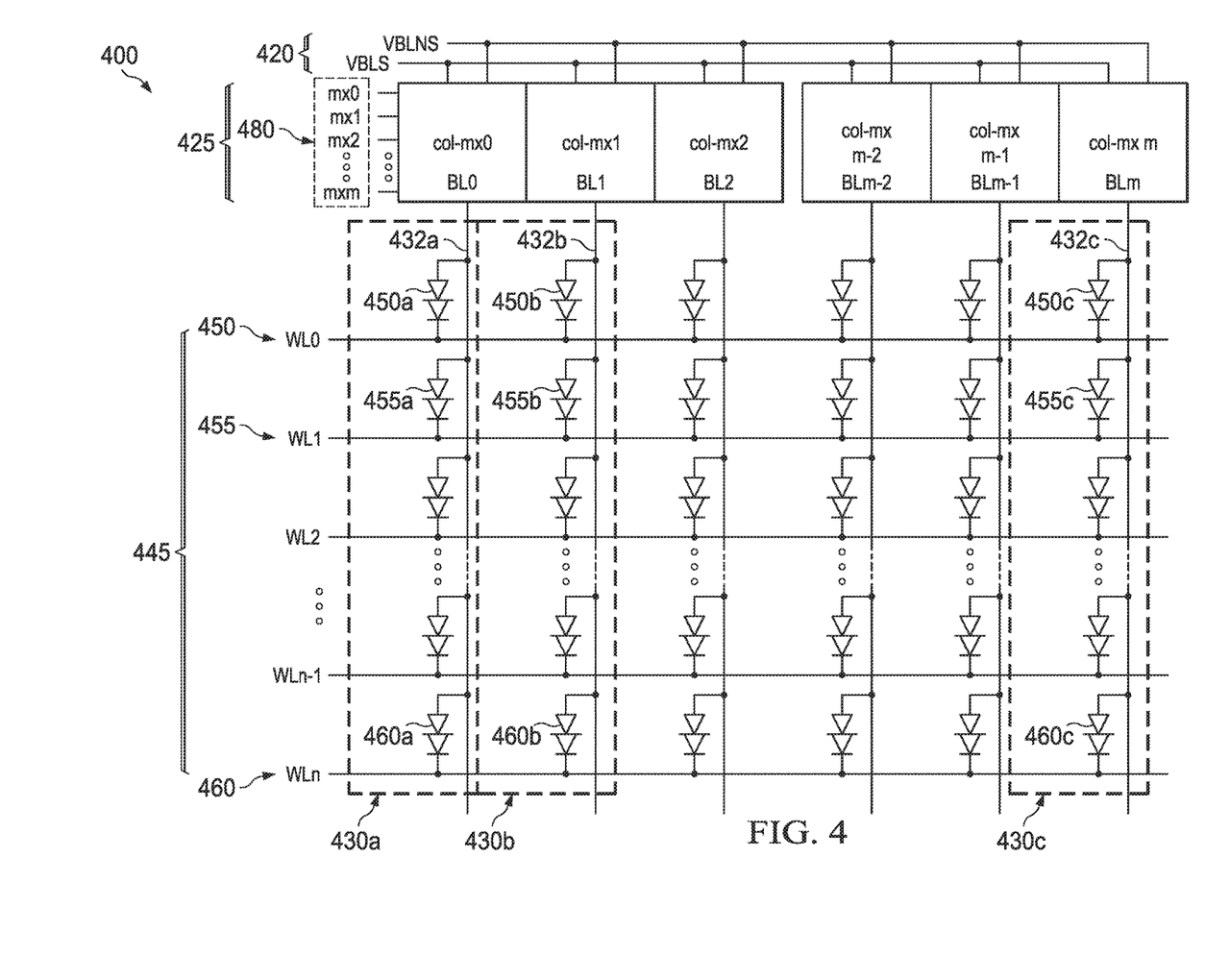
FIG. 4 depicts an apparatus for managing voltage levels within a cross-point memory array of memory cells when accessing a subset of the memory cells, in accordance with some embodiments of the present disclosure.

Each of the plurality of column multiplexors may take as input one of the two voltage levels 320 and output to a respective electrically conducting line corresponding to a respective column of memory cells. By using the plurality 325 of column multiplexors, a first subset of the second plurality of electrically conducting lines (e.g., a subset of 332a, 332b, 332c) may be selected (e.g., for a read operation), and a second subset of the second plurality of electrically conducting lines (e.g., a subset of 332a, 332b, 332c) may be unselected (e.g., for a de-bias setting during the read operation). In some embodiments, each of the second plurality of electrically conducting lines (e.g., 332a, 332b, 332c; 432a, 432b, 432c; $BL_0$-$BL_m$) may be coupled to a respective sense amplifier (not shown), which may be used to detect whether a respective voltage level of a respective electrically conducting line of the second plurality of electrically conducting lines changes. In some embodiments, each of the first plurality of electrically conducting lines (e.g., 350, 355, 360; 450, 455, 460; $WL_0$ to $WL_n$) may be coupled to a respective sense amplifier (not shown), which may be used to detect whether a respective voltage level of a respective electrically conducting line of the first plurality of electrically conducting lines changes. Sense amplifiers are described in P. Gray et. al., "Analysis and Design of Analog Integrated Circuits", John Wiley & Sons, $5^{th}$ Ed. 2009, which is hereby incorporated by reference herein in its entirety.

In some embodiments, each of the second plurality of electrically conducting lines (e.g., 332a, 332b, 332c; 432a, 432b, 432c; $BL_0$-$BL_m$) may be coupled to a respective column driver and/or BL driver (not shown), which may be used to change or switch a respective voltage level of a respective electrically conducting line of the second plurality of electrically conducting lines. Column drivers, BL drivers, and/or other driver circuitry are described in P. Gray et. al., "Analysis and Design of Analog Integrated Circuits", John Wiley & Sons, $5^{th}$ Ed. 2009, which is hereby incorporated by reference herein in its entirety. In some embodiments, each of the first plurality of electrically conducting lines (e.g., 350, 355, 360; 450, 455, 460; $WL_0$ to $WL_n$) may be coupled to a respective row driver and/or WL driver (not shown), which may be used to change or switch a respective voltage level of a respective electrically conducting line of the first plurality of electrically conducting lines. Row drivers, WL drivers, and/or other driver circuitry are described in P. Gray et. al., "Analysis and Design of Analog Integrated Circuits", John Wiley & Sons, $5^{th}$ Ed. 2009, which is hereby incorporated by reference herein in its entirety.

FIG. 4 depicts an apparatus for managing voltage levels within a cross-point memory array of thyristor memory cells 445 (e.g., thyristor memory cell 100 of FIG. 1) when accessing a subset of the memory cells, in accordance with some embodiments of the present disclosure. The apparatus of FIG. 4 may be similar to the apparatus of FIG. 3 except that the memory cells of FIG. 4 are thyristor memory cells. FIG. 4 includes m columns (e.g., 430a, 430b, 430c) and n rows of thyristor memory cells 445. In some embodiments, FIG. 4 depicts a sub-array block 400 of thyristor memory cells. Each row of thyristor memory cells may correspond to an electrically conducting line of a first plurality of electrically conducting lines (e.g., 450, 455, 460; $WL_0$ to $WL_n$).

For example, a first row of thyristor memory cells (e.g., 450a, 450b, 450c) may correspond to electrically conducting line 450; a second row of thyristor memory cells (e.g., 455a, 455b, 455c) may correspond to electrically conducting line 455; and a third row of thyristor memory cells (e.g., 460a, 460b, 460c) may correspond to electrically conducting line 460. In some embodiments, the first plurality of electrically conducting lines may be WLs. In some embodiments, the first plurality of electrically conducting lines may be BLs.

Each column (e.g., 430a, 430b, 430c) of thyristor memory cells may correspond to an electrically conducting line of a second plurality of electrically conducting lines (e.g., 432a, 432b, 432c; $BL_0$-$BL_m$). For example, a first column 430a of thyristor memory cells (e.g., 450a, 455a, 460a) may correspond to electrically conducting line 432a; a second column 430b of memory cells (e.g., 450b, 455b, 460b) may correspond to electrically conducting line 432b; and a third column 430c of memory cells (e.g., 450c, 455c, 460c) may correspond to electrically conducting line 432c. In some embodiments, the second plurality of electrically conducting lines may be BLs. In some embodiments, the second plurality of electrically conducting lines may be WLs.

FIG. 4 may include a plurality 425 of column multiplexors. Each of the plurality 425 of column multiplexors may correspond to a respective column of memory cells, and a respective electrically conducting line of the second plurality of electrically conducting lines. Each of the plurality 425 of column multiplexors may select between two voltage levels 420: a voltage level for a selected column (e.g., VBLS, voltage bit-line select) and a voltage level for an unselected column (e.g., VBLNS, voltage bit-line non-select). The plurality 425 of column multiplexors may be controlled by a plurality of select inputs 480 (e.g., $mx_0$-$mx_m$), where each of the plurality of select inputs may correspond to a respective column multiplexor, and select between the voltage level for the selected column, and the voltage level for the unselected column. For example, if an input for a multiplexor is 1, the voltage for a selected column may be output, column read voltage level may be selected, and if the input the for the multiplexor is 0, the de-biased voltage level may be selected.

Each of the plurality of column multiplexors may take as input one of the two voltage levels 420 and output to a respective electrically conducting line corresponding to a respective column of memory cells. By using the plurality 425 of column multiplexors, a first subset of the second plurality of electrically conducting lines (e.g., a subset of 432a, 432b, 432c) may be selected (e.g., for a read operation), and a second subset of the second plurality of electrically conducting lines (e.g., a subset of 432a, 432b, 432c) may be unselected (e.g., for a de-bias setting during the read operation).

Figure 5:
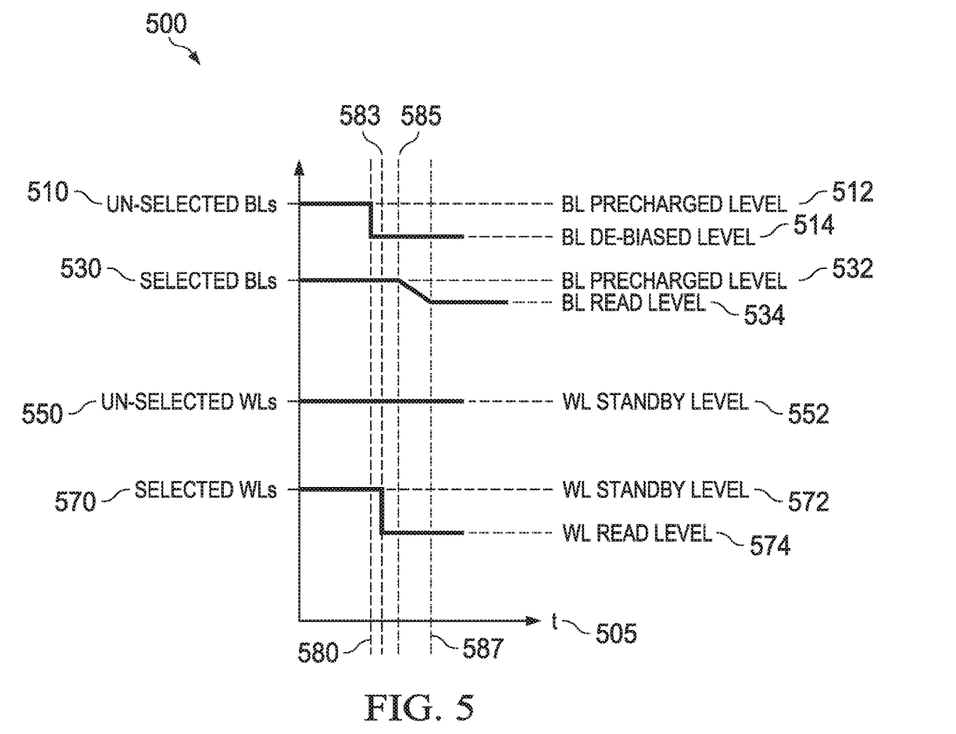
FIG. 5 depicts a timing diagram of voltages applied within a cross-point memory array of memory cells, in accordance with some embodiments of the present disclosure.

FIG. 5 depicts a timing diagram 500 of voltages applied within a cross-point memory array of memory cells, in accordance with some embodiments of the present disclosure. FIG. 5 includes a first waveform 510, second waveform 530, third waveform 550, and fourth waveform 570. In some embodiments, the third waveform 550 may correspond to voltage levels of an un-selected set of the first plurality of electrically conducting lines (e.g., a subset of 350, 355, 360 of FIG. 3; a subset of 450, 455, 460 of FIG. 4; a subset of WLs). In some embodiments, the fourth waveform 570 may correspond to a selected set of the first plurality of electrically conducting lines (e.g., a subset of 350, 355, 360 of FIG. 3; a subset of 450, 455, 460 of FIG. 4; a subset of WLs). In some embodiments, the first waveform 510 may correspond to voltage levels of an un-selected set of second plurality of electrically conducting lines (e.g., a subset of 332a, 332b, 332c of FIG. 3; a subset of 432a, 432b, 432c of FIG. 4; a subset of BLs). In some embodiments, the second waveform 530 may correspond to voltage levels of a selected set of the second plurality of electrically conducting lines (e.g., a subset of 332a, 332b, 332c of FIG. 3; a subset of 432a, 432b, 432c of FIG. 4; a subset of BLs).

The changing of the voltages on in the waveforms 510, 530, 550, and 570 may be controlled by a Finite State Machine (FSM), processor, microcontroller, or other control circuitry that may be in signal communication with a cross-point memory array (e.g., control circuitry on the same semiconductor substrate as, or on a separate semiconductor substrate from the cross-point memory array). For example, control circuitry may be in communication with driver circuitry and or sense amplifiers circuitry to cause the changing of the waveforms and/or detect voltage levels from the waveforms.

In some embodiments, the voltages applied to the first plurality of electrically conducting lines (e.g., 350, 355, 360 of FIG. 3; 450, 455, 460 of FIG. 4; WLs) may be set to a standby voltage level. In some embodiments, the voltages applied to the second plurality of electrically conducting lines (e.g., 332a, 332b, 332c of FIG. 3; 432a, 432b, 432c of FIG. 4; BLs) may be set to a first voltage level (e.g., a precharge voltage level). In some embodiments, where the memory cells are thyristor memory cells, a difference between the precharge voltage level (e.g., on BLs) and the standby voltage level (e.g., on WLs) may be less than a latching voltage (e.g., voltage 205, $V_L$ of FIG. 2) of the thyristor memory cells and/or greater than a holding voltage (e.g., voltage 215, $V_H$ of FIG. 2) of the thyristor memory cells.

In some embodiments, at time 580, the voltage (e.g., in waveform 510) applied to a first subset (e.g., an unselected subset) of the second plurality of electrically conducting lines (e.g., BLs), may be changed from the first voltage level 512 (e.g., a precharge voltage level) to a de-biased voltage level 514. In some embodiments, where the memory cells are thyristor memory cells, a difference between the de-biased voltage level (e.g., on BLs) and the standby voltage level (e.g., on WLs) may be less than a latching voltage (e.g., voltage 205, $V_L$ of FIG. 2) of the thyristor memory cells and/or greater than a holding voltage (e.g., voltage 215, $V_H$ of FIG. 2) of the thyristor memory cells.

In some embodiments, at time 583, voltages (e.g., in waveform 570) applied to a first subset (e.g., a selected subset) of the first plurality of electrically conducting lines (e.g., WLs), the voltages may be changed from the standby voltage level (e.g., 552, 572) to a first read voltage level 574. In some embodiments, where the memory cells are thyristor memory cells, a difference between a de-biased voltage level (e.g., on BLs) or a first voltage level (e.g., a precharge voltage level on BLs) and the first read voltage level (e.g., on WLs) may be less than a latching voltage (e.g., voltage 205, $V_L$ of FIG. 2) of the thyristor memory cells and/or greater than a holding voltage (e.g., voltage 215, $V_H$ of FIG. 2) of the thyristor memory cells. The voltages applied to the unselected subset of BLs may be changed from the first voltage level 512 to a de-biased voltage 514 before changing the voltages of the selected WLs in order to reduce the voltage drop across memory cells (e.g., thyristor memory cells) of the unselected subset of BLs and the WLs in order to reduce the current flowing into a selected WL which may affect the ability to read selected BLs on the WL. The voltages applied to the unselected set of BLs may be changed at a fast rate in order to reduce the amount of current flowing into the selected WLs. In some embodiments, at time 580, voltages (e.g., in waveform 570) applied to a first subset (e.g., a selected subset) of the first plurality of electrically conducting lines (e.g., WLs), may be changed from the standby voltage level (e.g., 552, 572) to a first read voltage level 574, prior to the voltage (e.g., in waveform 510) applied to a first subset (e.g., an unselected subset) of the second plurality of electrically conducting lines (e.g. BLs) being changed (e.g., at time 583) from a first voltage level 512 (e.g., a precharge voltage level) to a de-biased voltage level 514.

In some embodiments, a single WL per memory block (e.g., 350, 355, 360; 450, 455, 460) may be changed from the standby voltage level (e.g., 552, 572) to the first read voltage level 574. In some embodiments, more than a single WL per memory block (e.g., two WLs coupled to a same memory cell) may be changed from the standby voltage level (e.g., 552, 572) to the first read voltage level 574. Between time 585 and time 587, a voltage level (e.g., in waveform 530) of each electrically conducting line (e.g., a BL) of a second subset (e.g., a selected subset) of the second plurality of electrically conducting lines (e.g., BLs coupled to the single WL, or multiple WLs, that was changed from the standby voltage level to the first read voltage level) may transition from the first voltage level 532 (e.g., a precharge voltage level) to a second read voltage level 534, depending on whether a respective memory cell at an intersection between a respective BL and the single WL is in a high resistance state or a low resistance state. If the respective memory cell is in a high resistance state, then a voltage level of the respective bit line will change from the precharge voltage level to the second read voltage level 534. If the respective cell is in a low resistance state, then a voltage level of the respective bit line may change from the precharge voltage level to the second read voltage level 534. Accordingly, a transition of the voltage level from the precharge voltage level to the second read voltage level may indicate that the respective memory cell is in a low resistance state. A lack of a transition of the voltage level may indicate that the respective memory cell is in a high resistance state.

This description has been presented for the purposes of illustration. It is not intended to be exhaustive or to limit the invention to the precise form described, and many modifications and variations are possible in light of the teaching above. For example, PMOS devices may be used in place of NMOS devices, and NMOS devices may be used in place of PMOS devices in suitable configurations. The figures are not drawn to scale and are for illustrative purposes. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method for accessing a memory cell in a cross-point memory array of memory cells, the method comprising:
    setting voltages applied to a first plurality of electrically conducting lines to a standby voltage level;
    changing a voltage applied to a first subset of a second plurality of electrically conducting lines from a first voltage level to a de-biased voltage level;
    changing voltages applied to a subset of the first plurality of electrically conducting lines from the standby voltage level to a first read voltage level; and
    subsequent to changing voltages applied to the subset of the first plurality of electrically conducting lines, detecting whether a voltage at each of a second subset of the second plurality of electrically conducting lines changes from the first voltage level to a second read voltage level.

2. The method of claim 1, wherein the first plurality of electrically conducting lines are word-lines of the cross-point memory array.

3. The method of claim 1, wherein the second plurality of electrically conducting lines are bit-lines of the cross-point memory array.

4. The method of claim 1, wherein the subset of the first plurality of electrically conducting lines includes a word-line, the method comprising:
    changing voltages applied to the subset of the first plurality of electrically conducting lines from the standby voltage level to the first read voltage level, subsequent to changing the voltage applied to the first subset of the second plurality of electrically conducting lines.

5. The method of claim 1, further comprising:
    selecting the first subset and the second subset of the second plurality of electrically conducting lines using a plurality of multiplexors, wherein each of the plurality of multiplexors is coupled to a respective electrically conducting line of the second plurality of electrically conducting lines.

6. The method of claim 1, wherein the memory cells in the cross-point memory array comprise thyristor memory cells.

7. The method of claim 6, wherein the first voltage level is a precharge voltage level, the method further comprising:
    setting the voltage applied to the first subset of the second plurality of electrically conducting lines and the voltage applied to the second subset of the second plurality of electrically conducting lines to the precharge voltage level, prior to changing the voltage applied to the first subset of the second plurality of electrically conducting lines.

8. The method of claim 7, wherein a voltage difference between the precharge voltage level and the standby voltage level is less than a latching voltage of the thyristor memory cells.

9. The method of claim 6, wherein a voltage difference between the de-biased voltage level and the first read voltage level is less than a latching voltage of the thyristor memory cells.

10. The method of claim 6, wherein a voltage difference between the second read voltage level and the first read voltage level is less than a latching voltage of the thyristor memory cells.

11. An apparatus for accessing a memory cell in a cross-point memory array of memory cells, the apparatus comprising:
    a first plurality of driver circuitry configured to:
        set voltages applied to a first plurality of electrically conducting lines to a standby voltage level; and
        change voltages applied to a subset of the first plurality of electrically conducting lines from the standby voltage level to a first read voltage level;
    a second plurality of driver circuitry configured to change a voltage applied to a first subset of a second plurality of electrically conducting lines from a first voltage level to a de-biased voltage level; and
    a plurality of sense amplifier circuitry configured to detect whether a voltage at each electrically conducting line of a second subset of the second plurality of electrically conducting lines changes from the first voltage level to a second read voltage level, subsequent to the first plurality of driver circuitry changing voltages applied to the subset of the first plurality of electrically conducting lines.

12. The apparatus of claim 11, wherein the first plurality of electrically conducting lines are word-lines of the cross-point memory array.

13. The apparatus of claim 11, wherein the second plurality of electrically conducting lines are bit-lines of the cross-point memory array.

14. The apparatus of claim 11, wherein the subset of the first plurality of electrically conducting lines includes a word-line, and wherein the first plurality of driver circuitry are configured to change the voltages applied to the subset of the first plurality of electrically conducting lines from the standby voltage level to the first read voltage level, subsequent to the second plurality of driver circuitry changing the voltage applied to the first subset of a second plurality of electrically conducting lines.

15. The apparatus of claim 11, further comprising:
a plurality of multiplexors configured to select the first subset and the second subset of the second plurality of electrically conducting lines, wherein each of the plurality of multiplexors is coupled to a respective electrically conducting line of the second plurality of electrically conducting lines.

16. The apparatus of claim 11, wherein the memory cells in the cross-point memory array comprise thyristor memory cells.

17. The apparatus of claim 16, wherein the first voltage level is a precharge voltage level, and wherein the second plurality of driver circuitry is further configured to:
set the voltage applied to the first subset of the second plurality of electrically conducting lines and the voltage applied to the second subset of the second plurality of electrically conducting lines to the precharge voltage level, prior to changing the voltage applied to the first subset of the second plurality of electrically conducting lines.

18. The apparatus of claim 17, wherein a voltage difference between the precharge voltage level and the standby voltage level is less than a latching voltage of the thyristor memory cells.

19. The apparatus of claim 16, wherein a voltage difference between the de-biased voltage level and the first read voltage level is less than a latching voltage of the thyristor memory cells.

20. The apparatus of claim 16, wherein a voltage difference between the second read voltage level and the first read voltage level is less than a latching voltage of the thyristor memory cells.

* * * * *